(12) United States Patent
Kang

(10) Patent No.: US 9,804,440 B2
(45) Date of Patent: Oct. 31, 2017

(54) DISPLAY DEVICE

(71) Applicant: Samsung Display Co., Ltd., Yongin-si, Gyeonggi-Do (KR)

(72) Inventor: Kyungwon Kang, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 91 days.

(21) Appl. No.: 14/800,459

(22) Filed: Jul. 15, 2015

(65) Prior Publication Data

US 2016/0202513 A1    Jul. 14, 2016

(30) Foreign Application Priority Data

Jan. 12, 2015 (KR) .................. 10-2015-0004129

(51) Int. Cl.
*G02F 1/1335* (2006.01)
*H01L 27/32* (2006.01)
(Continued)

(52) U.S. Cl.
CPC ........... *G02F 1/1336* (2013.01); *G02B 6/003* (2013.01); *G02B 6/0031* (2013.01); *G02B 6/0055* (2013.01); *G02B 6/0068* (2013.01); *G02B 6/0073* (2013.01); *G02F 1/1368* (2013.01); *G02F 1/136286* (2013.01); *G09G 3/3426* (2013.01); *H01L 27/3276* (2013.01);
(Continued)

(58) Field of Classification Search
CPC ................ G02F 1/1336; G02F 1/1368; G02F 1/136286; G02F 2001/133616; G02B 6/003; G02B 6/0031; G02B 6/0055; G02B 6/0068; G02B 6/0073; G09G 3/3426; G09G 2320/0626; G09G 2320/0646; H01L 27/3276
See application file for complete search history.

(56) References Cited

U.S. PATENT DOCUMENTS

2006/0001806 A1*  1/2006  Uh ..................... G02F 1/133555
                                              349/114
2007/0018920 A1*  1/2007  Jo ......................... G09G 3/3225
                                              345/88

(Continued)

FOREIGN PATENT DOCUMENTS

KR     10-2002-0074871 A    10/2002
KR     10-0721574 B1          9/2006
(Continued)

*Primary Examiner* — Amare Mengistu
*Assistant Examiner* — Jennifer Zubajlo
(74) *Attorney, Agent, or Firm* — H.C. Park & Associates, PLC

(57) ABSTRACT

A display device includes a display panel including a light source area and a display area and including a base substrate having an upper surface facing a first direction, a panel light source part disposed on the upper surface corresponding to the light source area to emit a light to a second direction opposite to the first direction, and a display part disposed on the upper surface corresponding to the display area and a light guide plate disposed adjacent to the display panel in the second direction, receiving the light, and guiding the light to provide the light to the display area, and the display part displays an image using the light received from the light guide plate.

17 Claims, 7 Drawing Sheets

(51) Int. Cl.
*G09G 3/36* (2006.01)
*G02F 1/1362* (2006.01)
*G09G 3/34* (2006.01)
*F21V 8/00* (2006.01)
*G02F 1/1368* (2006.01)

(52) U.S. Cl.
CPC ............ *G02F 2001/133616* (2013.01); *G09G 2320/0626* (2013.01); *G09G 2320/0646* (2013.01)

(56) References Cited

U.S. PATENT DOCUMENTS

| | | | | |
|---|---|---|---|---|
| 2008/0123026 | A1* | 5/2008 | Kwag | G02F 1/133555 349/77 |
| 2008/0170175 | A1* | 7/2008 | Cho | G02F 1/133555 349/63 |
| 2012/0075698 | A1* | 3/2012 | Minami | G02B 6/0043 359/462 |
| 2013/0279195 | A1 | 10/2013 | Ahn et al. | |
| 2013/0335660 | A1* | 12/2013 | Jung | G02F 1/1345 349/42 |
| 2013/0342779 | A1* | 12/2013 | Jung | G02B 6/0083 349/43 |
| 2014/0056025 | A1* | 2/2014 | Kang | G02B 6/0066 362/609 |
| 2014/0085585 | A1* | 3/2014 | Sung | G02F 1/13458 349/143 |
| 2014/0104528 | A1* | 4/2014 | Jung | G02F 1/133305 349/43 |
| 2014/0368769 | A1* | 12/2014 | Lee | G02B 6/0068 349/65 |
| 2014/0375933 | A1* | 12/2014 | Park | G02F 1/133502 349/96 |
| 2015/0109763 | A1* | 4/2015 | Shinkai | G02F 1/1334 362/97.2 |
| 2015/0253484 | A1* | 9/2015 | Araki | G02B 6/0031 349/65 |
| 2015/0293402 | A1* | 10/2015 | Shinkai | G02F 1/13476 349/15 |

FOREIGN PATENT DOCUMENTS

| | | |
|---|---|---|
| KR | 10-2008-0006199 A | 1/2008 |
| KR | 10-0932239 B1 | 11/2009 |
| KR | 10-2012-0077414 A | 7/2012 |
| KR | 10-2014-0006252 A | 1/2014 |

\* cited by examiner

DISPLAY DEVICE

CLAIM OF PRIORITY

This U.S. non-provisional patent application claims the priority of and all the benefits accruing under 35 U.S.C. §119 of Korean Patent Application No. 10-2015-0004129, filed on Jan. 12, 2015 in the Korean Intellectual Property Office (KIPO), the contents of which are hereby incorporated by reference.

BACKGROUND OF THE INVENTION

1. Field of Disclosure

The present disclosure relates to a display device having a thin thickness.

2. Description of the Related Art

As one of flat panel display devices, a liquid crystal display has been used in various electronic devices. e.g., a television set, a monitor, a notebook computer, a mobile phone, etc., to display an image.

The liquid crystal display controls an intensity of an electric field applied to a liquid crystal material interposed between two substrates and controls an amount of light passing through the two substrates, to thereby display the image. The liquid crystal display includes a liquid crystal display panel to display the image and a backlight unit to provide the light to the liquid crystal display panel.

The backlight unit is classified into an edge-illumination type and a direct-illumination type depending on a position of a light source emitting the light. The edge-illumination type backlight unit includes a light guide plate and the light source providing the light to a side surface of the light guide plate, and the direct-illumination type backlight unit includes a diffusion plate and the light source disposed under the diffusion plate to provide the light to the diffusion plate.

SUMMARY OF THE INVENTION

The present disclosure provides a display device having a thin thickness.

Embodiments of the inventive concept provide a display device including a display panel including a base substrate including a light source area, a display area and an upper surface facing a first direction, a panel light source part disposed on the upper surface corresponding to the light source area and emitting a light to a second direction opposite to the first direction, and a display part disposed on the upper surface corresponding to the display area and a light guide plate disposed adjacent to the display panel in the second direction, receiving the light, and guiding the light to the display area. The display part displays an image using the light provided from the light guide plate.

The panel light source part includes a light emitting layer, a first electrode disposed between the light emitting layer and the upper surface of the base substrate, and a second electrode facing the first electrode with the light emitting layer interposed in-between the first electrode and the second electrode.

The first electrode is a transparent electrode and the second electrode is a reflective electrode.

The light emitting layer includes an organic light emitting material.

The display part includes a pixel including a liquid crystal layer, a third electrode interposed between the liquid crystal layer and the upper surface of the base substrate, and a fourth electrode facing the third electrode with the liquid crystal layer interposed in-between the third electrode and the fourth electrode.

The pixel further includes a transistor disposed between the third electrode and the upper surface of the base substrate and including a drain electrode connected to the third electrode.

The display device further includes a controller generating a light source control signal to control the panel light source part. The display panel includes a light source control line disposed on the upper surface of the base substrate and applying the light source control signal to the panel light source part.

The display panel further includes a gate line connected to the pixel and disposed on the upper surface of the base substrate and a data line insulated from the gate line, and one of the gate line and the data line is disposed on a same layer on which the light source control line is disposed.

The display device further includes a gate driver. The controller generates a gate control signal to control the gate driver, the display panel includes a gate control line to apply the gate control signal to the gate driver, and the light source control line is disposed on a same layer on which the gate control line is disposed.

The controller analyzes an input image applied thereto to generate the light source control signal on the basis of the analyzed result, the panel light source part includes a plurality of sub-panel light source parts connected to the light source control line, and the sub-panel light source parts are independently driven by the light source control signal.

The sub-panel light source parts generate a white light.

The sub-panel light source parts include a plurality of color panel light source parts generating different colors from each other.

The display area includes a matrix area and a gate driver area disposed between the matrix area and the light source area, and the display panel includes a gate driver mounted on the gate driver area.

The light guide plate includes a light incident part defined corresponding to the light source area and receiving the light exiting from the panel light source part, a light exit part defined corresponding to the display area and outputting the light to the display part, and a reflection member reflecting the light received from the light incident part to the light exit part.

The light exit part includes a light exit pattern disposed to correspond to the display area.

The display device further includes an optical member disposed between the base substrate and the light guide plate to correspond to the display area.

The display device further includes a reflection plate disposed adjacent to the light guide plate in the second direction.

According to the above, since the panel light source part is provided to the display panel, the display device is not required to have the area in which the separate light source is disposed. Thus, the thickness of the display device may be reduced.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
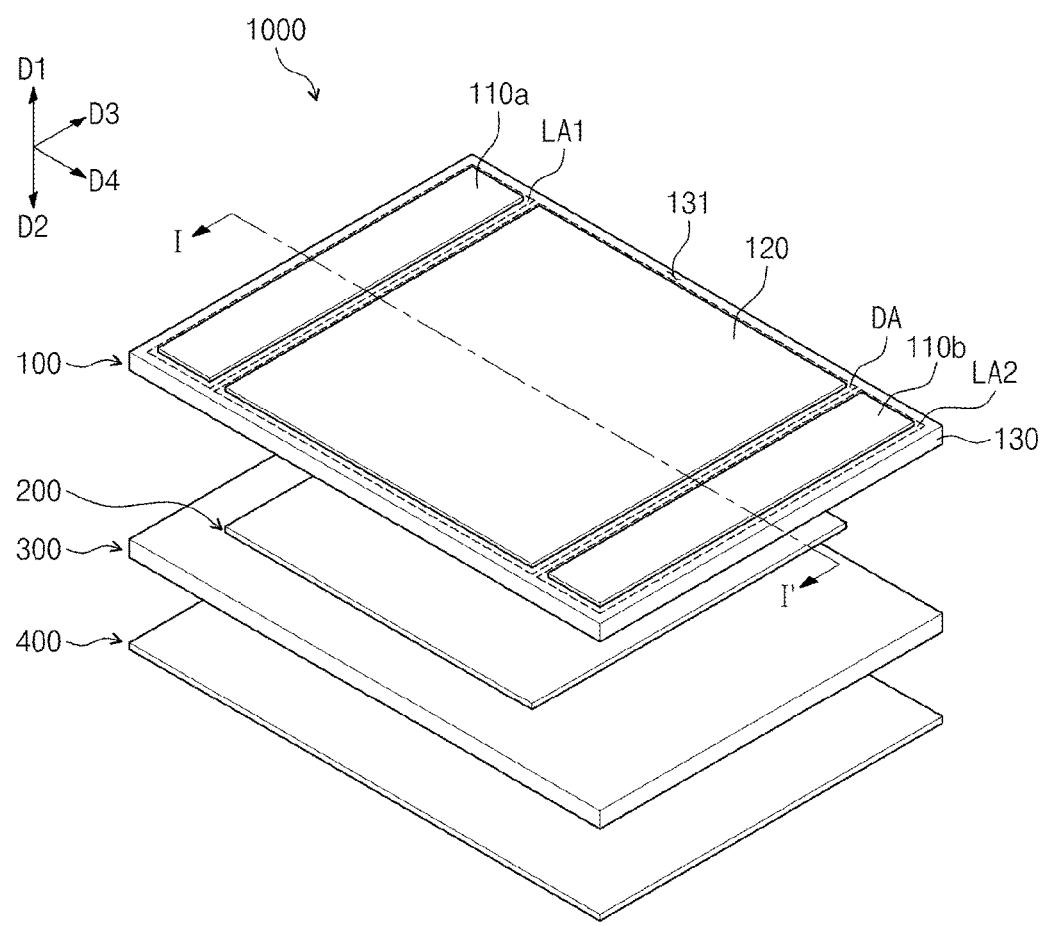
FIG. 1 is an exploded perspective view showing a display device according to an exemplary embodiment of the present disclosure.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the disclosure. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present disclosure will be explained in detail with reference to the accompanying drawings.

Figure 2:
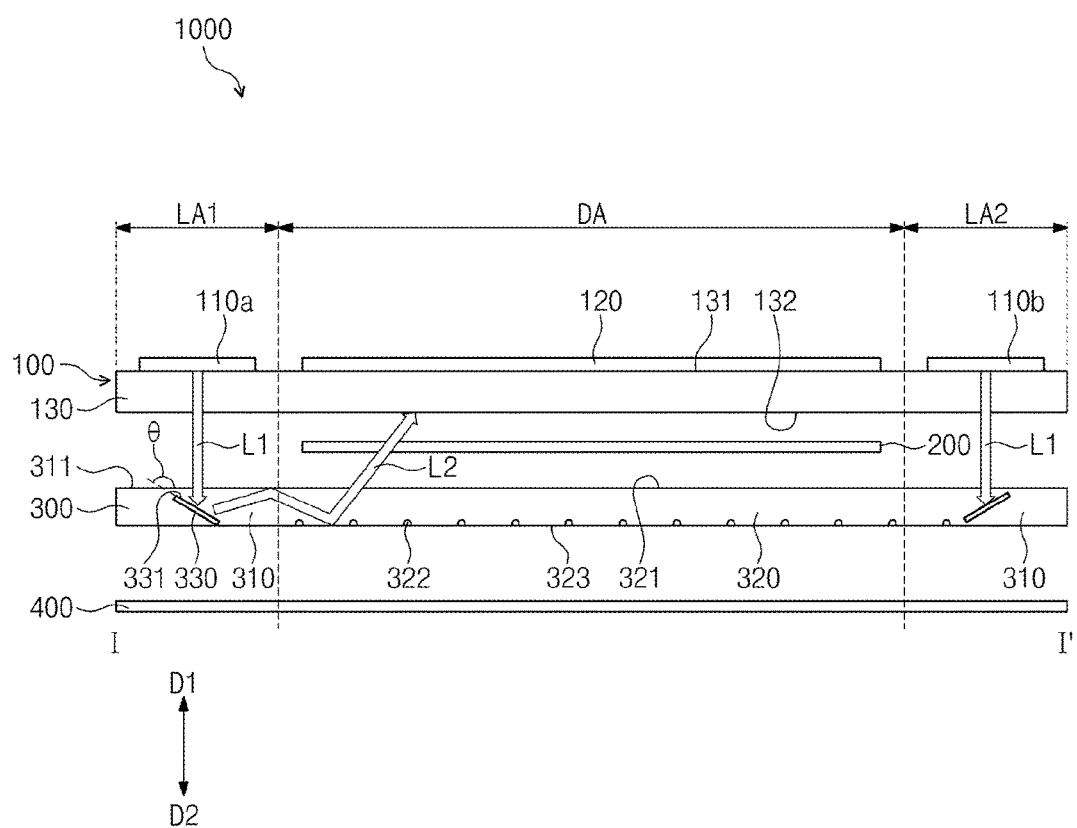
FIG. 2 is a cross-sectional view taken along a line I-I' of FIG. 1 to show the display device shown in FIG. 1.

FIG. 1 is an exploded perspective view showing a display device 1000 according to an exemplary embodiment of the present disclosure, and FIG. 2 is a cross-sectional view taken along a line I-I' of FIG. 1 to show the display device shown in FIG. 1.

Referring to FIGS. 1 and 2, the display device 1000 includes a display panel 100, an optical member 200, a light guide plate 300, and a reflection plate 400.

The display panel 100 includes a panel light source part, a display part 120, and a first substrate 130. The display panel 100 may have a substantially rectangular in-plane shape defined by two short sides substantially parallel to each other and two long sides substantially parallel to each other.

The first substrate 130 includes a light source area and a display area DA. The light source area includes a first light source area LA1 disposed at a left side of the first substrate 130 and a second light source area LA2 disposed at a right side of the first substrate 130. The display area DA is disposed between the first and second light source areas LA1 and LA2.

The panel light source part includes a first panel light source part 110a and a second panel light source part 110b disposed on an upper surface 131 of the first substrate 130 to correspond to the first and second light source areas LA1 and LA2, respectively. The first and second panel light source parts 110a and 110b generate a first light L1. In more detail, the first and second panel light source parts 110a and 110b generate the first light L1 and emit the first light L1 to a second direction D2. The first light L1 passes through the first substrate 130 and is provided to the light guide plate 300.

The light guide plate 300 faces the display panel 100 such that the optical member 200 is interposed between the light guide plate 300 and the display panel 100. That is, the light guide plate 300 is disposed adjacent to the display panel 100 in the second direction D2. The light guide plate 300 overlaps with the display panel 100 on a horizontal plane surface substantially perpendicular to the second direction D2.

The light guide plate 300 includes a light incident part 310 defined corresponding to the first and second light source areas LA1 and LA2, a light exit part 320 defined corresponding to the display area DA, and a reflection member 330.

The light exit part 320 includes a light exit surface 321 facing the optical member 200. The light exit surface 321 is defined corresponding to the display area DA. In addition, the light exit part 320 includes a light exit pattern 322. The light exit pattern 322, for instance, may have a protrusion shape protruding from a lower surface 323 of the light exit part 320 to a first direction D1 opposite to the second direction D2.

The light incident part 310 includes a light incident surface 311 facing the display panel 100. The light incident surface 311 corresponds to the first and second light source areas LA1 and LA2.

The reflection member 330 is disposed in the light incident part 310. The light reflection member 330 is inclined at a predetermined angle to reflect the light provided thereto to the light exit part 320. More particularly, an angle θ formed between a surface substantially parallel to a first surface 331 of the light reflection member 330 and the light incident surface 311 is an obtuse angle. The light reflection member 330 includes a light reflective material such as a metal (for example silver or gold), or a mirror.

The light incident surface 311 receives the first light L1 after the first light L1 passes through the first substrate 130. The first light L1 passing through the light incident surface 311 is reflected to the light exit part 320 as a second light L2 by the first surface 331 of the light reflection member 330. The second light L2 is guided by the light incident part 310 and the light exit part 320 and provided to the optical member 200 by the light exit pattern 322.

The reflection plate 400 is disposed adjacent to the light guide plate 300 in the second direction D2 and reflects the light, which is leaked without being directed to the display panel 100, of the first light L1 and the second light L2 to the display panel 100. The reflection plate 400 may include a light reflective material, such as polyethylene terephthalate (PET), aluminum, etc.

The optical member 200 is disposed between the light guide plate 300 and the display panel 100. The optical member 200 overlaps with the display area DA on the horizontal plane surface. For instance, the optical member 200 may include one diffusion sheet (not shown) to diffuse the light and two condensing sheets (not shown) to condense the light. The diffusion sheet is disposed on the light guide plate 300 and diffuses the light exiting from the light guide plate 300. The diffusion sheet may be formed of a transparent material, e.g., PET. The condensing sheets are disposed on the diffusion sheet and condense the light diffused by the diffusion sheet to improve a front brightness. Each of the condensing sheets includes a fine prism pattern (not shown) having a prism shape. In detail, each of the condensing sheets includes prism patterns extending in different directions from each other.

In the case that the optical member 200 overlaps with the first and second light source areas LA1 and LA2 on the horizontal plane surface, the first light L1 provided to the light incident surface 311 is diffused and the first light L1 is not efficiently provided to the light incident surface 311. Thus, the optical member 200 may not overlap with the first and second light source areas LA1 and LA2 on the horizontal plane surface such that the first light L1 is efficiently provided to the light incident surface 311. The second light L2 reaches to a lower surface 132 of the display area DA after passing through the optical member 200.

The display part 120 is provided on the upper surface 131 of the first substrate 130 corresponding to the display area DA. That is, the display part 120 is disposed between the first panel light source part 110a and the second panel light source part 110b. The display part 120 receives the second light L2 provided to the lower surface 132 of the display area DA and displays an image using the second light L2 received thereto.

According to the above, since the first panel light source part 110a, the second panel light source part 110b, and the display part 120 are disposed on the first substrate 130 and the display part 120 utilizes the light provided from the first and second panel light source parts 110a and 110b, the display device 1000 is not required to have an area for a separate light source at a lower portion of the display panel 100. As a result, a thickness of the display device 1000 may be reduced.

In addition, since the first and second panel light source parts 110a and 110b are disposed in the display panel 100, there is no need to assemble a separate light source. Therefore, a lack of uniformity in the image quality caused by deviation in assembly or a non-uniformity of the image quality caused by the additional light source itself may be prevented from existing.

Figure 3:
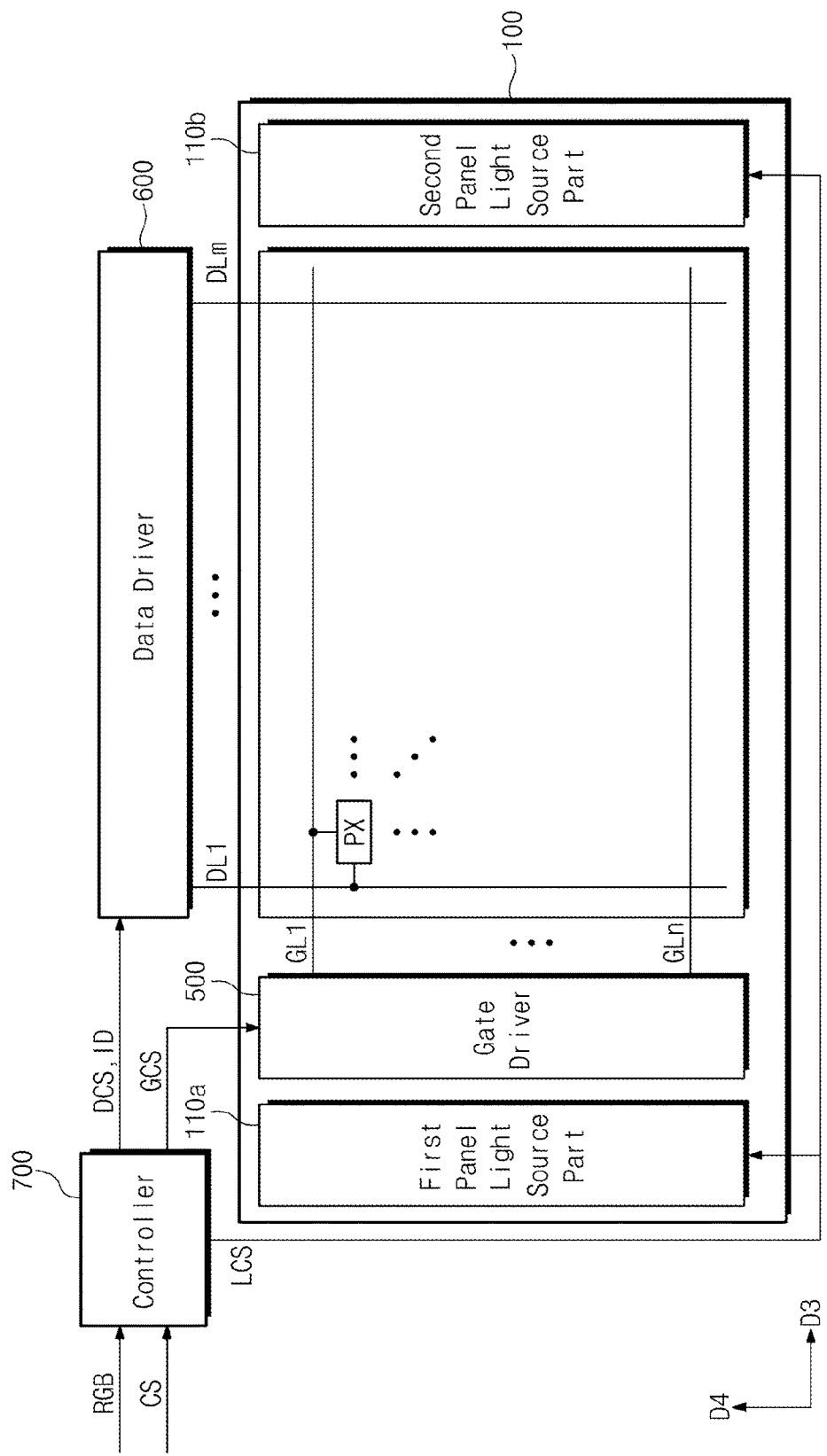
FIG. 3 is a block diagram showing the display device shown in FIG. 1.

FIG. 3 is a block diagram showing the display device shown in FIG. 1.

Referring to FIG. 3, the display device 1000 includes a gate driver 500 and a data driver 600, and a controller 700 controlling an operation of the gate driver 500 and the data driver 600.

The controller 700 receives input images RGB and a plurality of control signals CS from an outside thereof. The controller 700 converts a data format of the input images RGB to a data format appropriate to an interface between the data driver 600 and the controller 700 to generate output image data ID and applies the output image data ID to the data driver 600.

The controller 700 generates a data control signal DCS, e.g., an output start signal, a horizontal start signal, etc., and a gate control signal GCS, e.g., a vertical start signal, a vertical clock signal, a vertical clock bar signal, etc., on the basis of the control signals CS. The data control signal DCS is applied to the data driver 600 and the gate control signal GCS is applied to the gate driver 500.

The gate driver 500 sequentially outputs gate signals in response to the gate control signal GCS provided from the controller 700.

The data driver 600 converts the output image data ID to data voltages in response to the data control signal DCS provided from the controller 700 and applies the data voltages to the display panel 100.

The display panel 100 further includes a plurality of gate lines GL1 to GLn, a plurality of data lines DL1 to DLm, and a plurality of pixels PX.

The pixel PX serves as a basic element displaying a unit image. The display panel 100 has a resolution determined by the number of pixels PX arranged thereon. For the convenience of explanation, FIG. 3 shows only one pixel PX, and thus details of the other pixels will be omitted. Each pixel PX displays one of primary colors. The primary colors may include, but not limited to, a red color, a green color, a blue color, and a white color. That is, the primary colors may further include various colors, e.g., yellow, cyan, magenta, etc.

The gate lines GL1 to GLn extend in a third direction D3 and are arranged to be parallel to each other in a fourth direction D4 substantially perpendicular to the third direction D3. The gate lines GL1 to GLn are connected to the gate driver 500 to sequentially receive the gate signals from the gate driver 500.

The data lines DL1 to DLm extend in the fourth direction D4 and are arranged in the third direction D3 to be substantially parallel to each other. The data lines DL1 to DLm are connected to the data driver 600 to receive the data voltages from the data driver 600.

Each of the pixels PX is connected to a corresponding gate line of the gate lines GL1 to GLn and a corresponding data line of the data lines DL1 to DLm to be driven. In detail, the pixels PX are controlled in response to the gate signals and display the image corresponding to the data voltages.

The controller 700 generates a light source control signal LCS to control the first and second panel light source parts 110a and 110b. The first and second panel light source parts 110a and 110b generate the first light L1 (refer to FIG. 2) in response to the light source control signal LCS. More particularly, the light source control signal LCS controls a brightness, a color, and a generation timing of the first light L1.

The controller 700 is mounted on a printed circuit board (not shown) in an integrated circuit chip form and connected to the gate driver 500 and the data driver 600. The gate driver 500 and the data driver 600 are mounted on a flexible printed circuit (not shown) after being formed in plural driving chips, and then connected to the display panel 100 in a tape carrier package (TCP) scheme.

However, it should not be limited thereto or thereby. That is, the gate driver 500 and the data driver 600 may be mounted on the display panel 100 in a chip on glass (COG) scheme. In addition, the gate driver 500 may be substantially simultaneously formed with the pixels PX and mounted on the display panel 100 in an amorphous silicon TFT gate driver circuit (ASG) form.

In the present exemplary embodiment, the gate driver 500 is mounted on the display panel 100 in the ASG form and the data driver 600 is mounted on the flexible printed circuit in the form of driving chips.

Figure 4:
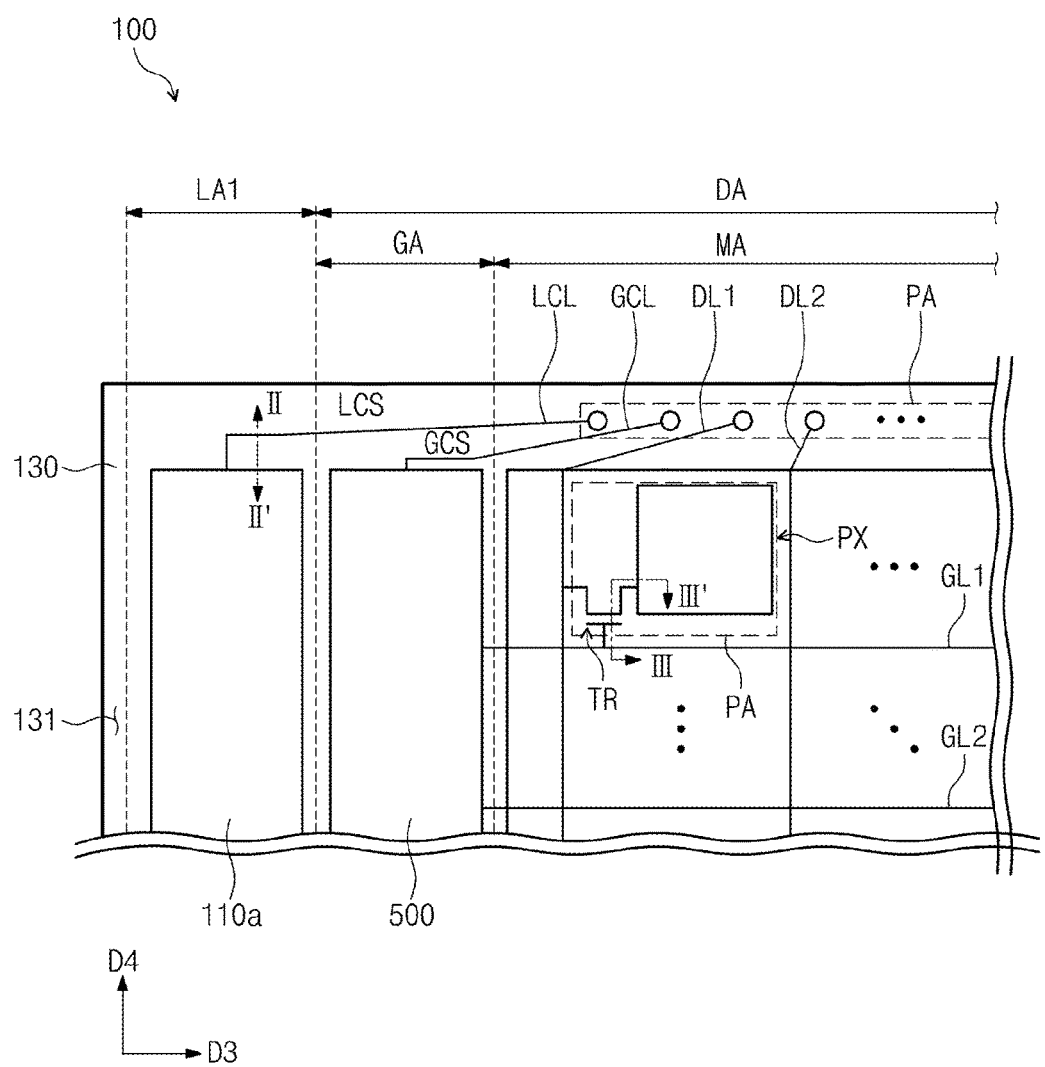
FIG. 4 is an enlarged plan view showing a portion of a display panel shown in FIG. 3.

FIG. 4 is an enlarged plan view showing a portion of the display panel shown in FIG. 3.

Referring to FIGS. 3 and 4, the display panel 100 includes a light source control line LCL and a gate control line GCL. For the convenience of explanation, FIG. 4 shows first and second data lines DL1 and DL2 of the data lines DL1 to DLm and first and second gate lines GL1 and GL2 of the gate lines GL1 to GLn.

Meanwhile, the display area DA of the display panel 100 includes a gate driver area GA and a matrix area MA. The gate driver area GA is disposed between the matrix area MA and the first light source area LA1.

A pad area PA is defined at one side of the matrix area MA in the fourth direction D4. The pad area PA overlaps with the flexible printed circuit. The flexible printed circuit applies the light source control signal LCS and the gate control signal GCS generated from the controller 700 and the data voltages generated from the data driver 600 to the display panel 100.

The light source control line LCL is disposed on the upper surface 131 of the first substrate 130. More particularly, one end of the light source control line LCL is disposed in the pad area PA and electrically connected to the flexible printed circuit. The other end of the light source control line LCL is connected to the first panel light source part 110a. The light source control line LCL applies the light source control signal LCS generated from the controller 700 to the first panel light source part 110a.

The gate driver 500 is disposed in the gate driver area GA. The gate driver 500 is substantially and simultaneously formed together with a transistor TR of the pixel PX, which is formed in the matrix area MA, and mounted on the display panel 100 in the ASG form.

The gate control line GCL is disposed on the upper surface 131 of the first substrate 130. In more detail, one end of the gate control line GCL is disposed in the pad area PA and electrically connected to the flexible printed circuit. The other end of the gate control line GCL is connected to the gate driver 500. The gate control line GCL applies the gate control signal GCS generated from the controller 700 to the gate driver 500.

The pixels PX are arranged in a matrix configuration in the matrix area MA. FIG. 3 shows only one pixel PX as a representative example. The pixels PX are respectively arranged in areas defined by the gate lines and the data lines crossing the gate lines.

The first and second gate lines GL1 and GL2 are disposed on the upper surface 131 of the first substrate 130. One ends of the first and second gate lines GL1 and GL2 are connected to the gate driver 500, and the gate signal generated from the gate driver 500 is applied to the pixel PX through the first and second gate lines GL1 and GL2.

The first and second data lines DL1 and DL2 are disposed on the upper surface 131 of the first substrate 130 and are arranged to be insulated from the first and second gate lines GL1 and GL2. One ends of the first and second data lines DL1 and DL2 are disposed in the pad area PA and electrically connected to the flexible printed circuit. The first and second data lines DL1 and DL2 apply the data voltage generated from the data driver 600 to the pixel PX.

As an example, the light source control line LCL may be disposed on the same layer as the gate control line GCL. In this case, the light source control line LCL may be substantially and simultaneously formed together with the gate control line GCL.

However, it should not be limited thereto or thereby. That is, the light source control line LCL may be disposed on the same layer as one of the gate line and the data line. In this case, the light source control line LCL may be substantially and simultaneously formed together with one of the gate line and the data line.

As described above, since the light source control line LCL is realized by forming a line on the upper surface 131 of the first substrate 130, a separate line is not required to be connected to the panel light source part. Thus, a structure of the display device 1000 becomes simplified, and a manufacturing cost of the display device 1000 is reduced. In addition, since the light source control line LCL may be formed together with another line disposed on the upper surface 131 of the first substrate 130, the manufacturing process of the light source control line LCL is simplified.

Figure 5:
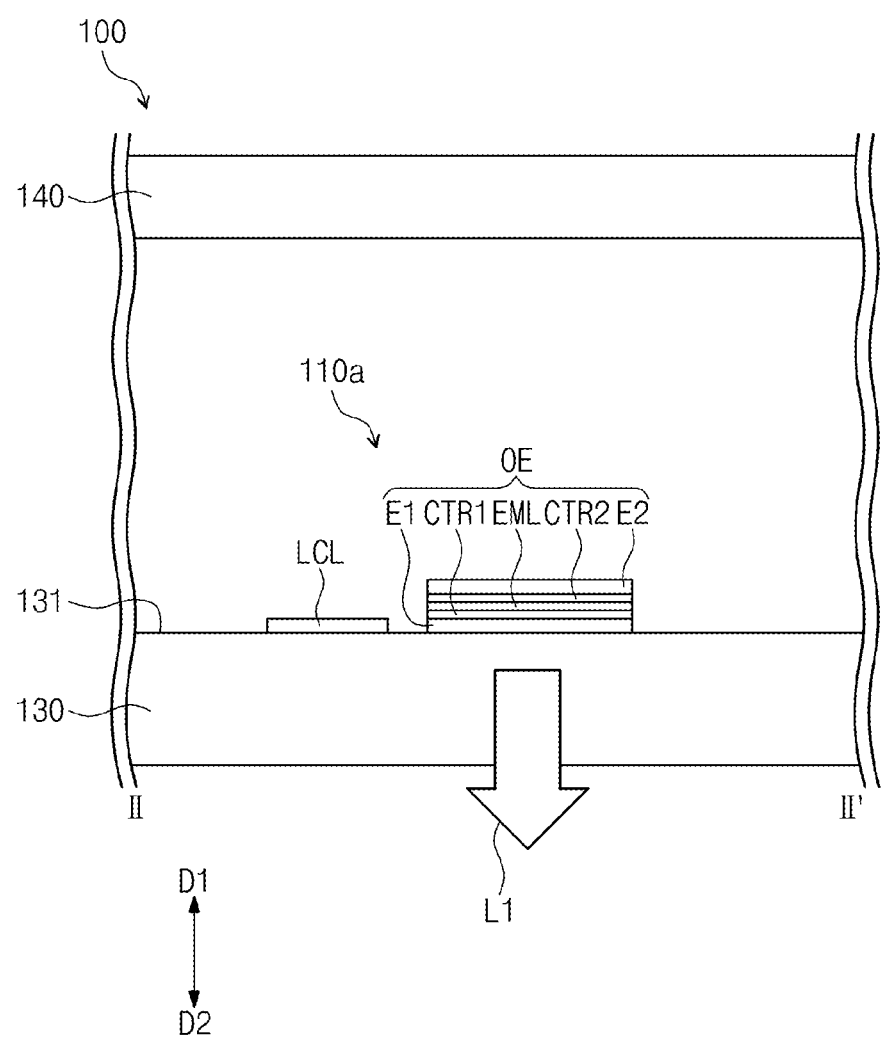
FIG. 5 is a cross-sectional view taken along a line II-II' of FIG. 4 to show a display panel shown in FIG. 3.

FIG. 5 is a cross-sectional view taken along a line II-II of FIG. 4.

Referring to FIG. 5, the first panel light source part 110a includes a light emitting device OE. As an example, the light emitting device OE may include an organic light emitting device, but it should not be limited thereto or thereby. That is, the light emitting device OE may include a light emitting diode (LED) including an inorganic material such as gallium arsenide (GaAs).

The light emitting device OE includes a first electrode E1, a first carrier transport area CTR1, a light emitting layer EML, a second carrier transport area CTR2, and a second electrode E2. The first electrode E1 is disposed on the upper surface 131 of the first substrate 130, and the light emitting layer EML and the second electrode E2 are sequentially stacked on the first electrode E1. The second electrode E2 faces the first electrode E1 such that the light emitting layer EML is interposed between the second electrode E2 and the first electrode E1.

The first electrode E1 may be a transparent electrode. In this case, the first electrode E1 may include a transparent metal oxide, e.g., indium tin oxide (ITO), indium zinc oxide (IZO), zinc oxide (ZnO), indium tin zinc oxide (ITZO), etc. In the present exemplary embodiment, the first electrode E1 may be an anode providing holes, but it should not be limited thereto or thereby. That is, the first electrode E1 may be a cathode providing electrons.

The second electrode E2 may be a transflective electrode or a reflective electrode. When the second electrode E2 is the transflective electrode or the reflective electrode, the second electrode E2 includes Ag, Mg, Al, Pt, Pd, Au, Ni, Nd, Ir, Cr, Li, Ca, LiF/Ca, LiF/Al, Mo, Ti, or a compound or mixture thereof, e.g., a mixture of Ag and Mg. In the present exemplary embodiment, the second electrode E2 is a cathode, but it should not be limited thereto or thereby. That is, the second electrode E2 may be an anode.

The light emitting layer EML has a single-layer structure of a single material, a single-layer structure of different materials from each other, or a multi-layer structure of different materials from each other.

The light emitting layer EML is formed by various methods, such as a vacuum deposition method, a spin coating method, a casting method, a Langmuir-Blodgett (LB), an inkjet printing method, a laser printing method, a laser induced thermal imaging (LITI), etc.

The light emitting layer EML includes an organic light emitting material generally used, for example, materials emitting red, green, and blue color lights. To this end, the light emitting layer EML includes a fluorescent material or a phosphorescent material. In addition, the light emitting layer EML includes a host and a dopant.

As the host, for example, Alq3(tris(8-hydroxyquinolino) aluminum), CBP(4,4'-bis(N-carbazolyl)-1,1'-biphenyl), PVK(poly(n-vinylcabazole)), ADN(9,10-di(naphthalene-2-yl)anthracene), TCTA(4,4',4"-Tris(carbazol-9-yl)-triphenylamine), TPBi(1,3,5-tris(N-phenylbenzimidazole-2-yl) benzene), TBADN(3-tert-butyl-9,10-di(naphth-2-yl) anthracene), DSA(distyrylarylene), CDBP(4,4'-bis(9-carbazolyl)-2,2'-dimethyl-biphenyl), MADN(2-Methyl-9,10-bis (naphthalen-2-yl)anthracene) may be used, however, it should not be limited thereto or thereby.

When the light emitting layer EML emits the red color light, the light emitting layer EML includes the fluorescent material containing PBD:Eu(DBM)3(Phen)(tris(dibenzoyl-methanato)phenanthoroline europium) or perylene. When the light emitting layer EML emits the red color light, the dopant included in the light emitting layer EML may be selected from a metal complex, such as PIQIr(acac)(bis(1-phenylisoquinoline) acetylacetonate iridium), PQIr(acac) (bis(1-phenylquinoline)acetylacetonate iridium), PQIr(tris (1-phenylquinoline)iridium), PtOEP(octaethylporphyrin platinum), etc., or an organometallic complex.

When the light emitting layer EML emits the green color light, the light emitting layer EML includes the fluorescent material containing Alq3(tris(8-hydroxyquinolino)aluminum). When the light emitting layer EML emits the green color light, the dopant included in the light emitting layer EML may be selected from a metal complex such as Ir(ppy)3(fac-tris(2-phenylpyridine)iridium) or an organometallic complex.

When the light emitting layer EML emits the blue color light, the light emitting layer EML includes the fluorescent material containing one selected from spiro-DPVBi, spiro-6P, distyryl-benzene (DSB), distyryl-arylene (DSA), a polyfluorene-based polymer, and a poly(p-phenylene vinylene)-based polymer. When the light emitting layer EML emits the blue color light, the dopant included in the light emitting layer EML may be selected from a metal complex such as (4,6-F2ppy)2Irpic and an organometallic complex.

In the present exemplary embodiment, the first carrier transport area CTR1 may be, but not limited to, a hole transport area. The hole transport area includes at least one of a hole injection layer, a hole transport layer, a buffer layer, and an electron block layer.

The hole transport area has a single-layer structure of a single material, a single-layer structure of different materials from each other, or a multi-layer structure of different materials from each other.

For instance, the hole transport area has a single-layer structure of different materials from each other, a structure of the hole injection layer/the hole transport layer, which are sequentially stacked on the first electrode E1, or a structure of the hole injection layer/the hole transport layer/the buffer layer, which are sequentially stacked on the first electrode E1, however it should not be limited thereto or thereby.

The second carrier transport area CTR2 may be, but not limited to, an electron transport area. The electron transport area includes at least one of a hole block layer, an electron transport layer, and an electron injection layer, but it should not be limited thereto or thereby.

For instance, the electron transport area has a structure of the electron transport layer/the electron injection layer or the electron transport layer/the electron injection layer/the hole block layer, which are sequentially stacked on the light emitting layer EML, or the electron transport area may have a single-layer structure configured to include two or more layers mixed with each other.

The display panel 100 further includes a second substrate 140. The second substrate 140 faces the first substrate 130 such that the light emitting device OE is interposed between the first substrate 130 and the second substrate 140. Although not shown in FIG. 5, the display panel 100 includes a sealing member encapsulating the light emitting device OE. The sealing member is provided to surround the light emitting device OE between the first and second substrates 130 and 140 and protects the light emitting device OE from external moisture and oxygen.

In addition, as another example, the light emitting device OE may be sealed by a thin film encapsulation (TFE) covering the light emitting device OE to protect the light emitting device OE from external moisture and oxygen. The TFE has a single-layer structure of a single material, a single-layer structure of different materials from each other, or a multi-layer structure of different materials from each other. The TEF includes an organic material, an inorganic material, or a mixture thereof.

When a driving voltage is applied to the first and second electrodes E1 and E2 and a driving current flows through the light emitting layer EML, the light emitting layer EML generates the first light L1. The first light L1 directly travels to the second direction D2 through the first electrode E1 and the first substrate 130 or the first light L1 is reflected by the second electrode E2 to travel to the second direction D2 through the first electrode E1 and the first substrate 130.

As described above, the light source control line LCL is disposed on the upper surface 131 of the first substrate 130. As an example, the first electrode E1 is formed on the same layer as the light source control line LCL.

Figure 6:
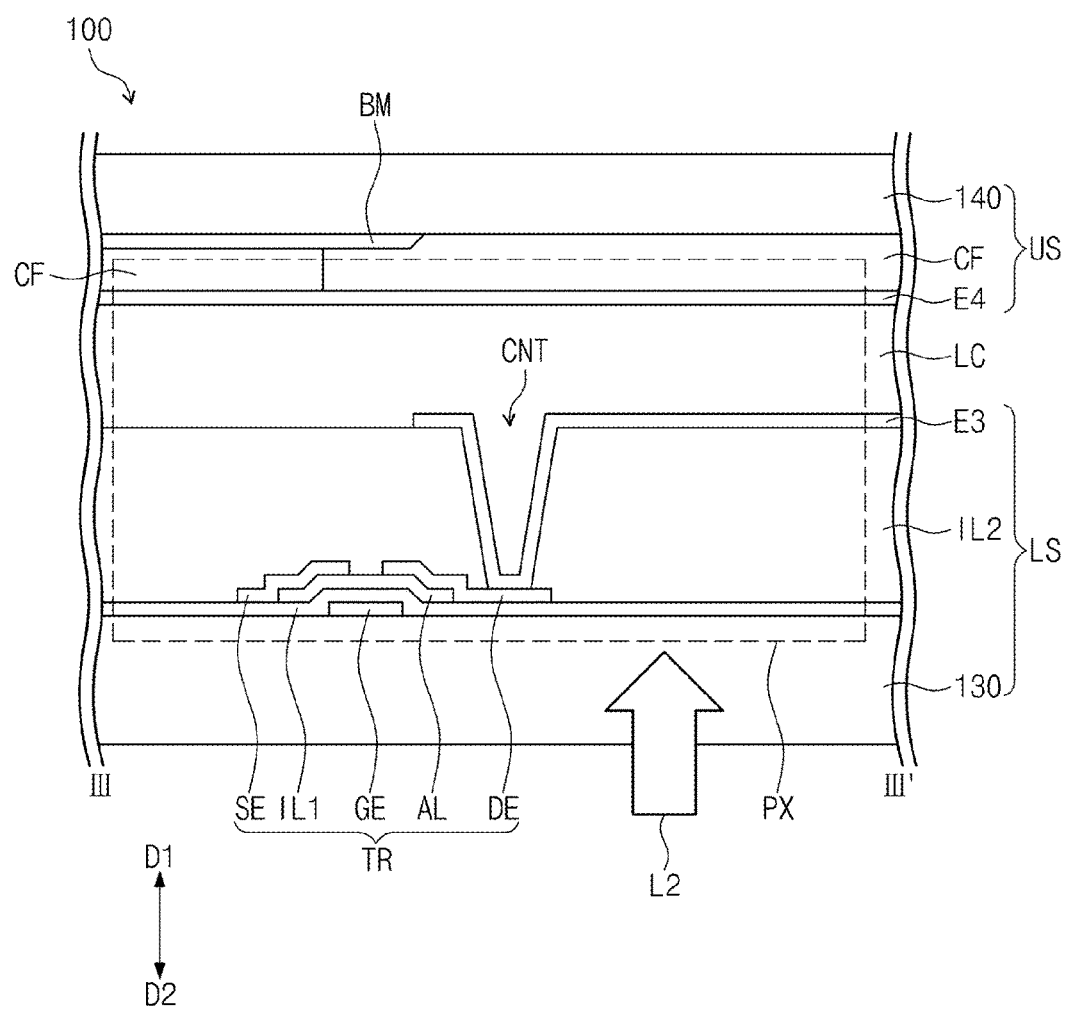
FIG. 6 is a cross-sectional view taken along a line III-III' of FIG. 4 to show the display panel shown in FIG. 4.

FIG. 6 is a cross-sectional view taken along a line III-III' of FIG. 4.

The display part 120 includes a lower substrate LS, the liquid crystal layer LC, and an upper substrate US.

The lower substrate LS includes the first substrate 130, a first insulating layer IL1, a second insulating layer IL2, a third electrode E3, and a transistor TR.

The transistor TR includes a gate electrode GE, the first insulating layer IL1, a semiconductor layer AL, a source electrode SE, and a drain electrode DE. The gate electrode GE is disposed on the first substrate 130 and branched from the first gate line GL1 (refer to FIG. 4). The semiconductor layer AL is disposed on the gate electrode GE such that the first insulating layer IL1 in interposed between the semiconductor layer AL and the gate electrode GE. The source electrode SE is branched from the first data line DL1 (refer to FIG. 4) to make contact with the semiconductor layer AL, and the drain electrode DE is spaced apart from the source electrode SE and makes contact with the semiconductor layer AL.

The second insulating layer IL2 covers the transistor TR and the first insulating layer IL1. The second insulating layer IL2 includes a contact hole CNT recessed toward the second direction D2. An upper surface of the drain electrode DE is exposed by the contact hole CNT.

The third electrode E3 is disposed on the second insulating layer IL2 and electrically connected to the upper surface of the drain electrode DE, which is exposed through the contact hole CNT. The third electrode E3 includes a transparent metal oxide, e.g., ITO, IZO, ITZO, etc.

The upper surface US includes the second substrate 140, a color filter CF, a black matrix BM, and a fourth electrode E4.

The black matrix BM is formed on the second substrate 140 to correspond to a light blocking area (not shown). The light blocking area corresponds to areas where the data lines, the transistor TR and the gate lines are disposed. A light leakage may occur in the light blocking area. The black matrix BM is disposed to correspond to the light blocking area, and thus the light leakage is prevented from occurring.

The color filter CF is formed on the second substrate 140 and filters components of the light, which passes through the liquid crystal layer LC, corresponding to a specific wavelength to assign a color to the light. In the present exemplary embodiment, the color filter CF is disposed on the upper substrate US, however, it should not be limited thereto or thereby. That is, the color filter CF may be disposed on the lower substrate LS.

The fourth electrode E4 is formed on the color filter CF. The fourth electrode E4 is formed of a transparent conductive material. The fourth electrode E4 includes a transparent metal oxide, such as ITO, IZO, ITZO, etc.

The liquid crystal layer LC is interposed between the lower substrate LS and the upper substrate US and includes liquid crystal molecules having a dielectric anisotropy and an optical anisotropy.

The pixel PX includes the transistor TR, the third electrode E3, the liquid crystal layer LC, the fourth electrode E4, and the color filter CF. The second light L2 is provided to the pixel PX through the first substrate 130, and the second light L2 is controlled by the liquid crystal molecules driven by an electric field formed between the third electrode E3 and the fourth electrode E4.

Figure 7:
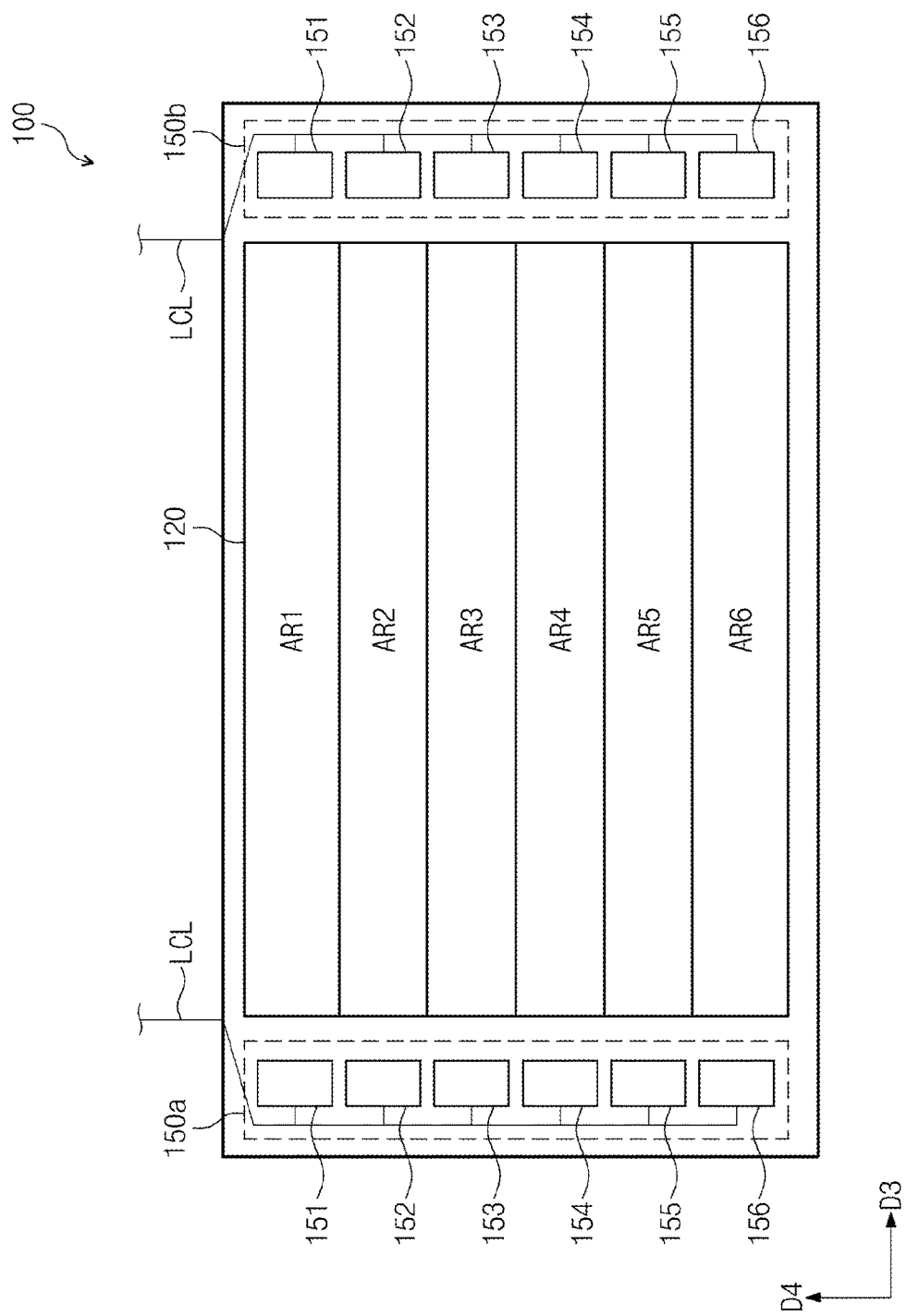
FIG. 7 is a plan view showing a display panel according to another exemplary embodiment of the present disclosure.

FIG. 7 is a plan view showing a display panel according to another exemplary embodiment of the present disclosure.

Referring to FIG. 7, each of first and second panel light source parts 150a and 150b includes first to sixth sub-panel light source parts 151 to 156.

The first to sixth sub-panel light source parts 151 to 156 are arranged in the fourth direction D4 in one column. The first to sixth sub-panel light source parts 151 to 156 are electrically connected to a light source control line LCL. The first to sixth sub-panel light source parts 151 to 156 receive first to sixth sub-light source control signals provided through the light source control line LCL. The first to sixth sub-panel light source parts 151 to 156 may be independently driven in response to the first to sixth sub-light source control signals, respectively.

In the present exemplary embodiment, the controller 700 analyzes input images RGB to generate the first to sixth sub-light source control signals on the basis of the analyzed result and drives the first to sixth sub-panel light source parts 151 to 156 in a local dimming method.

In more detail, the controller 700 divides a display part 120 into first to sixth areas AR1 to AR6 respectively corresponding to the first to sixth sub-panel light source parts 151 to 156, analyzes the input images RGB corresponding to the first to sixth areas AR1 to AR6, and generates the first to sixth sub-light source control signals.

For instance, in a case that an average grayscale value of the input image RGB corresponding to the first area AR1 is relatively greater and an average grayscale value of the input image RGB corresponding to the sixth area AR6 is relative smaller, the first to sixth sub-light source control signals are generated such that a brightness of the light generated from the first sub-panel light source part 151 becomes greater than a brightness of the light generated from the sixth sub-panel light source part 156.

In the present exemplary embodiment, each of the first to sixth sub-panel light source parts 151 to 156 generates a white light. In this case, a light emitting layer EML (refer to FIG. 5) of the first to sixth sub-panel light source parts 151 to 156 includes an organic light emitting material that generates the white light.

In addition, each of the first to sixth sub-panel light source parts 151 to 156 may include a plurality of color panel light source parts (not shown) generating different colors from each other. In the present exemplary embodiment, each of the first to sixth sub-panel light source parts 151 to 156 includes a red panel light source part, a green panel light source part, and a blue panel light source part, which generate a red light, a green light, and a blue light, respectively. Then, the light emitting layer EML of the red, green, and blue panel light source parts includes an organic light emitting material generating the red, green, and blue lights. As described above, when the first to sixth sub-panel light source parts 151 to 156 include the color panel light source parts, the display panel 100 may be driven in a color dimming method.

Although the exemplary embodiments of the present disclosure have been described, it is understood that the present disclosure should not be limited to these exemplary embodiments but various changes and modifications can be made by one ordinary skilled in the art within the spirit and scope of the present disclosure as hereinafter claimed.

What is claimed is:

1. A display device comprising:
    a display panel having a light source area and a display area, the display panel, comprising:
        a base substrate including an upper surface facing a first direction,
        a panel light source part disposed on the upper surface in the light source area and emitting a light to a second direction opposite to the first direction, and
        a display part disposed on the upper surface in the display area; and
    a light guide plate disposed on the display panel, the light guide plate receiving the light and guiding the light to the display area, the base substrate disposed between the light guide plate and the panel light source part.

2. The display device of claim 1, wherein the panel light source part comprises:

a light emitting layer;
a first electrode disposed between the light emitting layer and the upper surface of the base substrate; and
a second electrode facing the first electrode with the light emitting layer interposed between the first electrode and the second electrode.

3. The display device of claim 2, wherein the first electrode is a transparent electrode and the second electrode is a reflective electrode.

4. The display device of claim 3, wherein the light emitting layer comprises an organic light emitting material.

5. The display device of claim 2, wherein the display part comprises a pixel comprising:
a liquid crystal layer;
a third electrode interposed between the liquid crystal layer and the upper surface of the base substrate; and
a fourth electrode facing the third electrode with the liquid crystal layer interposed between the third electrode and the fourth electrode.

6. The display device of claim 5, wherein the pixel further comprises a transistor disposed between the third electrode and the upper surface of the base substrate and comprising a drain electrode connected to the third electrode.

7. The display device of claim 6, further comprising a controller generating a light source control signal to control the panel light source part, wherein the display panel comprises a light source control line disposed on the upper surface of the base substrate and applying the light source control signal to the panel light source part.

8. The display device of claim 7, wherein the display panel further comprises a gate line connected to the pixel and disposed on the upper surface of the base substrate and a data line insulated from the gate line, and one of the gate line and the data line is disposed on a same layer on which the light source control line is disposed.

9. The display device of claim 7, further comprising a gate driver, wherein the controller generates a gate control signal to control the gate driver, the display panel comprises a gate control line to apply the gate control signal to the gate driver, and the light source control line is disposed on a same layer on which the gate control line is disposed.

10. The display device of claim 7, wherein the controller analyzes an input image applied thereto to generate the light source control signal on the basis of the analyzed result, the panel light source part comprises a plurality of sub-panel light source parts connected to the light source control line, and the sub-panel light source parts are independently driven by the light source control signal.

11. The display device of claim 10, wherein the sub-panel light source parts generate a white light.

12. The display device of claim 10, wherein the sub-panel light source parts comprise a plurality of color panel light source parts generating different colors from each other.

13. The display device of claim 1, wherein the display area comprises a matrix area and a gate driver area disposed between the matrix area and the light source area, and the display panel comprises a gate driver mounted on the gate driver area.

14. The display device of claim 1, wherein the light guide plate comprises
a light incident part defined corresponding to the light source area and receiving the light exiting from the panel light source part,
a light exit part defined corresponding to the display area and outputting the light to the display part, and
a reflection member reflecting the light received from the light incident part to the light exit part.

15. The display device of claim 14, wherein the light exit part comprises a light exit pattern disposed to correspond to the display area.

16. The display device of claim 1, further comprising an optical member disposed between the base substrate and the light guide plate to correspond to the display area.

17. The display device of claim 1, further comprising a reflection plate disposed adjacent to the light guide plate in the second direction.

* * * * *